United States Patent [19]
Flowers et al.

[11] Patent Number: 5,754,592
[45] Date of Patent: May 19, 1998

[54] METHOD AND APPARATUS FOR RANDOMIZED OVERSAMPLING

[75] Inventors: Mark B. Flowers, Sunnyvale; John A. C. Bingham, Palo Alto; Michael D. Agah, Sunnyvale, all of Calif.

[73] Assignee: Amati Communications Corporation, San Jose, Calif.

[21] Appl. No.: 678,882

[22] Filed: Jul. 2, 1996

[51] Int. Cl.$^6$ .................................................. H03M 1/10
[52] U.S. Cl. .......................... 375/243; 375/260; 375/254; 375/285; 341/143
[58] Field of Search ........................ 375/243, 254, 375/285, 296, 260; 341/200, 143, 14 A, 899, 122; 364/724.04, 724.1

[56] References Cited

U.S. PATENT DOCUMENTS

| | | | |
|---|---|---|---|
| 5,061,925 | 10/1991 | Sooch et al. | 375/243 |
| 5,153,593 | 10/1992 | Walden et al. | 375/243 |
| 5,369,403 | 11/1994 | Temes et al. | 341/143 |
| 5,414,424 | 5/1995 | Cabler | 341/143 |
| 5,446,460 | 8/1995 | Cabler | 341/143 |

*Primary Examiner*—Wellington Chin
*Assistant Examiner*—Jean B. Corrielus
*Attorney, Agent, or Firm*—Beyer & Weaver, LLP

[57] ABSTRACT

An oversampling technique that improves signal-to-quantization noise ratio without requiring substantial amounts of processing power is disclosed. The oversampling technique determines the oversample values by successively scaling the previous value using a scaling factor. The effect of the invention is the randomize the quantization error for each of the oversample values so that the quantization error becomes uncorrelated from one oversample value to the next. When such decorrelation occurs, the quantization noise is spread over the enlarged frequency band associated with the oversampling. The invention is applicable to any transmission scheme which utilizes oversampling and digital-to-analog conversion.

20 Claims, 5 Drawing Sheets

METHOD AND APPARATUS FOR RANDOMIZED OVERSAMPLING

BACKGROUND OF THE INVENTION

1. Field of the Invention

The present invention relates to digital transmission systems and, more particularly, to oversampling techniques used in digital transmission systems.

2. Description of the Related Art

A digital transmission system operates to modulate an input signal for transmission over a transmission path. Typically, a transmission system processes the input signal in digital form and then converts the digital input signal to an analog signal for subsequent transmission over the transmission path. The digital-to-analog conversion is performed by a digital-to-analog converter within the transmission system.

In such transmission systems, the digital-to-analog converter has a fixed number of bits and induces a certain amount of quantizing noise on the analog signals which are output from the digital-to-analog converter. The power spectral density (PSD) of the resulting analog signals is such that the signal-to-noise ratio is essentially fixed (at least initially) by the number of bits of the digital-to-analog converter. As a result, depending upon the particular application in which the transmission system is to be utilized, the number of bits of the digital-to-analog converter must be properly chosen so as not only to handle the incoming signal's dynamic range but also to have a sufficient signal-to-noise ratio. However, each additional bit that is required in the digital-to-analog converter is a significant cost element for the transmission system. Thus, in designing a transmission system, it is desirable to minimize the number of bits required in the digital-to-analog converter, yet still maintain a sufficiently high signal-to-noise ratio for the application. In the case of multi carrier modulation systems (such as discrete multi tone modulation), greater dynamic ranges are typically required.

Oversampling is a technique that is used to improve the signal-to-noise ratio in transmission systems by spreading out the quantization noise induced by the digital-to-analog converter over a greater frequency range. The effect is to improve the signal-to-quantization noise ratio for a fixed number of bits of the digital-to-analog converter so that as a matter of design, the number of bits required by the digital-to-analog converter can be reduced. For example, by oversampling by a factor of four (that is, a primary sample and three oversamples per every sample) the required number of bits for the digital-to-analog converter can be reduced by one bit.

Conventionally, oversampling has not been easy to implement. The related techniques of zero stuffing and sample and hold are often considered oversampling techniques, but they are not effective in spreading the quantization noise and therefore do not lead to an improvement in signal-to-quantization noise ratio. See, e.g., P. P. Vaidyanathan, "Multirate systems and filters banks," Prentice Hall, 1993. Zero stuffing operates to stuff or utilize zero (0) values for the oversampled values. In contrast, the sample and hold technique replicates the value of the original sample for each of the oversampled values. On the other hand, an oversampling technique that has been successful in spreading the quantization noise is called an interpolation filter. The interpolation filter can, for example, be combined with zero stuffing to effectively oversample the transmit signal such that the quantization noise is spread over a larger frequency band. On a general level, the interpolation filter operates to interpolate between the sampled values so as to determines the oversampled values. Hence, when used with zero stuffing, the interpolation filter changes the oversampled values from their initial zero value to a value which better approximates the likely actual value of the signal between adjacent samples. See, e.g., P. P. Vaidyanathan, "Multirate systems and filters banks," Prentice Hall, 1993. The problem, however, is that interpolation filters require a substantial amount of processing time and power to determine the interpolated oversampled values. This extensive processing required to implement oversampling with interpolation filters affects the overall speed with which the transmission system can operate and has become a bottleneck to high speed transmission of signals.

Thus, there is a need for oversampling techniques that are able to improve the signal-to-quantization noise ratio, yet not require substantial amounts of processing time or power.

SUMMARY OF THE INVENTION

Broadly speaking, the invention is an oversampling technique that improves signal-to-quantization noise ratio without requiring substantial amounts of processing power. According to the invention, the oversampling technique determines the oversample values by successively scaling the previous value by a scaling factor. For example, the scaling factor may be $(1 \pm 2^{-n})$. The effect of the invention is to randomize the quantization error for each of the oversample values so that the quantization error becomes uncorrelated from one oversample value to the next. When such decorrelation occurs, the quantization noise is spread over the enlarged frequency band associated with the oversampling. Consequently, the signal-to-quantization noise ratio is improved. The invention is applicable to any transmission scheme which utilizes oversampling and digital-to-analog conversion.

The invention can be implemented in numerous ways, including as a method, a system or an apparatus. Several embodiment of the invention are described below.

As a method for reducing the quantization noise caused by a m-bit digital-to-analog converter, an embodiment of the invention includes the operations of: receiving a digital signal to be transmitted; oversampling the digital signal to produce a series of output values, the series of output values including a primary value and one or more subsequent values, and each of the subsequent values being scaled from the respective previous one of the values by a factor of $(1 \pm 2^{-n})$, where n and m are integers and n is less than m; and supplying the output values to the digital-to-analog converter.

As a transmission system having an input line and transmission lines, an embodiment of the invention includes: an encoder for encoding an input signal over the input line to produce a digital signal for transmission; an oversampling unit for oversampling the digital signal to produce a primary sampled value and at least one oversampled value, a first of the oversampled values being scaled by a predetermined factor with respect to the first sampled value, and any other oversampled values being successively scaled by the predetermined factor from the respective previous oversampled value; a digital-to-analog converter for converting the primary sampled value and the oversampled values to analog signals; and an interface circuit for coupling the analog signals to the transmission lines.

As a terminal for a transmission system using multi carrier modulation, an embodiment of the invention includes: a transmit path, a receive path, and a hybrid circuit.

The transmit path includes a multichannel modulating apparatus for transforming a transmit signal from a frequency domain to a time domain; an oversampler for oversampling the transmit signal output by said multichannel modulating apparatus, the transmit signal samples produced by said oversampler form a series of sample values, the series of sample values includes a primary value followed by one or more subsequent values, and each of the subsequent values being scaled from the respective previous one of the sample values by a predetermined factor, and a digital-to-analog converter (DAC) for converting the transmit signal samples produced by said oversampler to analog transmit signals for transmission. The receive path includes an analog-to-digital converter (ADC) for converting an analog receive signal into digital receive signal samples, and a multichannel demodulating apparatus for transforming the digital receive signal samples from the time domain to the frequency domain. The hybrid circuit coupled to the transmit path and the receive path for coupling the analog transmit signals to and the analog receive signals from a bi-directional transmission path.

The advantages to the invention are numerous. One advantage of the invention is that the oversampling can be performed very rapidly. As a result, greater data transmission speed can be obtained. Also, because the invention operates rapidly, greater oversampling can be performed than previously available. Another advantage is that the oversampling technique according to the invention operates to improve the signal-to-quantization noise ratio of signals to be transmitted by spreading the quantization error induced by the digital-to-analog converter over an enlarged frequency range created by the oversampling. As a result, the precision needed by the digital-to-analog converter may be reduced so as to provide a cost savings. Still another advantage of the invention is that the oversampling technique can be implemented with only shift and add operations which can be carried out very rapidly either in dedicated hardware circuitry or computer implemented instructions.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention pertains to an oversampling technique that improves signal-to-quantization noise ratio without requiring substantial amounts of processing power. According to the invention, the oversampling technique determines the oversample values by successively scaling the previous value using a factor. For example, the factor may be $(1 \pm 2^{-n})$. The invention is applicable to any transmission scheme which utilizes oversampling and digital-to-analog conversion.

The effect of the invention is the randomize the quantization error for each of the oversample values so that the quantization error becomes uncorrelated from one oversample value to the next. When such decorrelation occurs, the quantization noise is spread over the enlarged frequency range (band) associated with the oversampling. Consequently, the signal-to-quantization noise ratio is improved. The oversampling technique according to the invention can be implemented with shift and add operations which can be carried out very rapidly either in dedicated hardware circuitry or computer implemented instructions.

Embodiments of the invention are discussed below with reference to FIGS. 1–5. However, those skilled in the art will readily appreciate that the detailed description given herein with respect to these figures is for explanatory purposes as the invention extends beyond these limited embodiments.

Figure 1:
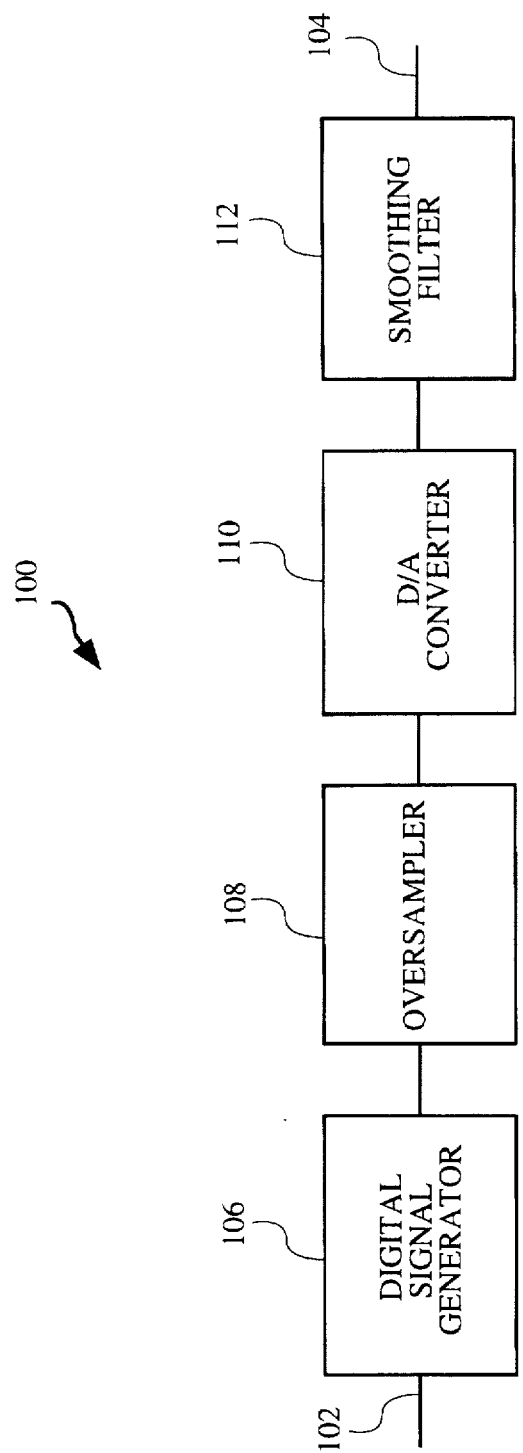
FIG. 1 is a block diagram of a transmitter according to an embodiment of the invention.

FIG. 1 is a block diagram of a transmitter 100 according to an embodiment of the invention. The transmitter 100 receives an input signal 102 that is to be transmitted and outputs a transmit signal 104. Thereafter, the transmit signal 104 is coupled to a transmission path for transmission.

The transmitter 100 includes a digital signal generator 106 which receives the input signal 102 and produces a digital signal. Typically, the digital signal produced by the digital signal generator 106 is a time-varying signal. The digital signal generator 106 outputs samples of the digital signal at a rate (referred to as the minimum sampling rate $F_S$) that is greater than twice the highest frequency component of the signal. The digital signal is then supplied to an oversampler 108. The oversampler 108 oversamples the digital signal by an integer multiple of the frequency of the minimum sampling rate $F_S$. For example, oversampling by a factor of four essentially samples the digital signal at the frequency of $4F_S$. In accordance with the invention, the oversampler 108 obtains a sampled value from the digital signal itself, and then from the sampled value determines the next oversampled value. Each of the oversampled values is successively determined by reducing the previous value by a factor of $(1-2^{-n})$, where n is an integer which is greater than one and less than the number of bits of the digital-to-analog converter 110. The output of the digital-to-analog converter 110 is then supplied to a smoothing filter 112 which smoothes out the analog signal to produce the transmit signal 104.

The invention randomizes the quantization error for each of the oversample values so that the quantization error becomes uncorrelated from one oversampled value to the next. Consequently, by using the oversampling technique according to the invention, the quantization noise associated with the digital-to-analog converter 110 is spread over the frequency band from zero to one half of the oversampling frequency $N \cdot F_S$, so as to increase the signal-to-quantization noise ratio of the signals to be transmitted by 10logN dB.

Figure 2:
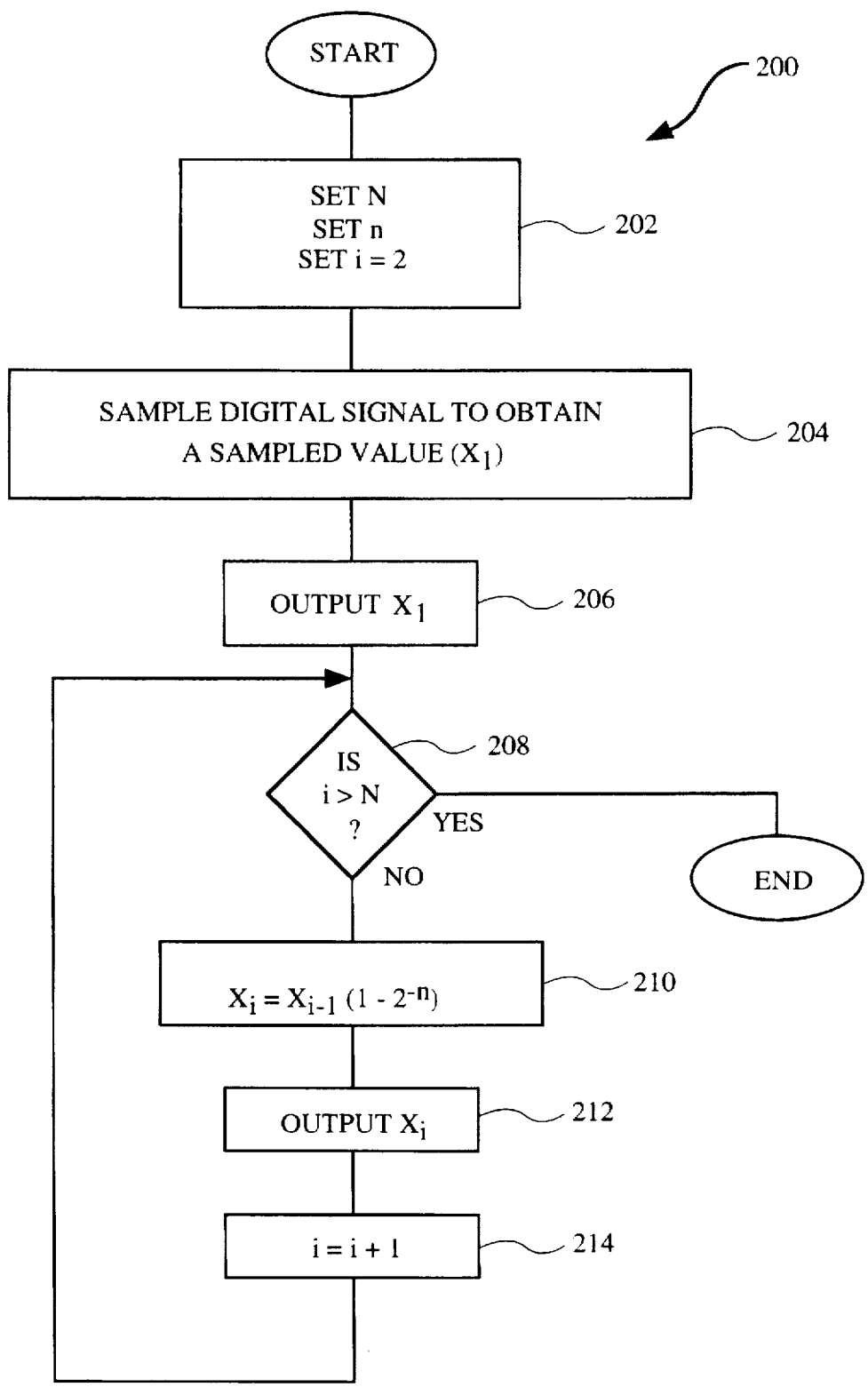
FIG. 2 is a flow diagram of an oversampling process according to an embodiment of the invention.

FIG. 2 is a flow diagram of an oversampling process 200 according to an embodiment of the invention. In one embodiment, the oversampling process 200 is performed by the oversampler 108 illustrated in FIG. 1.

The oversampling process 200 initially sets 202 the variables N, n and i. The variable N is an indicator of the number of oversamples to be taken. The variable n is an indicator of the power of two (2) that is used to determine the reduction factor. The variable i is an integer with an initial value equal to two (2). After these variables are set 202, the digital signal is sampled 204 to obtain a sample value $X_1$. The sample value $X_1$ can then be output 206 to the digital-to-analog converter 110.

Next, a decision 208 determines whether the variable i, which serves as an index, is greater than the variable N. The decision 208 determines whether all the oversamples have been determined. If all the oversamples have been determined (i>N), then the oversample process 200 is complete and ends.

On the other hand, when all the oversamples have not been determined (i≤N), the next oversample value is determined. In this case, a computation 210 is performed to determine the oversample value $X_i$. The oversample value $X_i$ is determined in accordance with the following equation:

$$X_i = X_{i-1}(1-2^{-n}) \quad (1)$$

where n is an integer greater than 1 and less than m, with m being an integer indicating the number of bits of the digital-to-analog converter 110.

After the oversample value $X_i$ is computed 210, the oversample value $X_i$ is output 212 to the digital-to-analog converter 110. Thereafter, the index variable i is incremented 214 and processing returns to repeat block 208 and subsequent blocks until all of the oversample values have been determined. Optionally, all of the values $(X_1-X_N)$ being output to the digital-to-analog converter 110 could be output simultaneously at the end of the oversampling process 200. The oversampling process 200 could also simultaneously process and/or output sample values for multiple channels of a multichannel transmission system.

Figure 3:
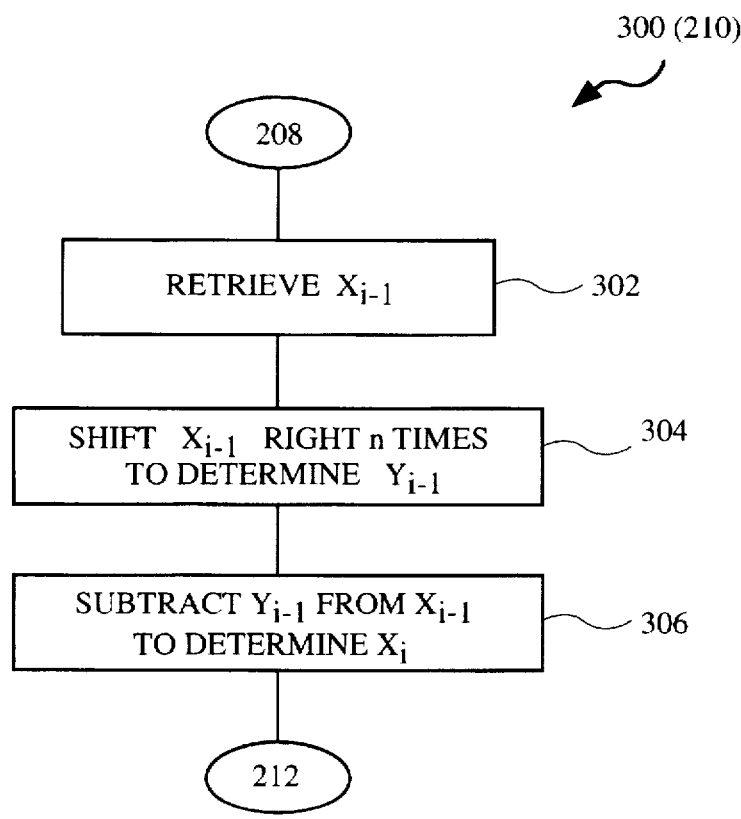
FIG. 3 is a flow diagram of an oversample value determination process according to an embodiment of the invention.

FIG. 3 is a flow diagram of an oversample value determination process 300 according to an embodiment of the invention. The oversample value determination process 300 is an embodiment for the computing block 210 in FIG. 2 and occurs between the blocks 208 and 212 of the oversampling process 200 illustrated in FIG. 2.

The oversample value determination process 300 initially retrieves 302 the value $X_{i-1}$. The value $X_{i-1}$ is referred to as the previous value and is used to determine the current value $X_i$. Typically, the value $X_{i-1}$ would be temporarily stored in a memory area after it was initially determined. Then, the previous value $X_{i-1}$ is shifted 304 right n times to determine the value $Y_{i-1}$. The value $Y_{i-1}$ represents an intermediate value which is a reduced version of the previous value. Each shift operation divides the previous value $X_{i-1}$ by two (2). Next, the value $Y_{i-1}$ is subtracted 306 from the value $X_{i-1}$ to determine the value $X_i$. In other words, the next value $X_i$ (oversample value) is determined by subtracting the intermediate value $Y_{i-1}$ from the previous value $X_{i-1}$. Accordingly, the blocks 302-306 perform the computation specified by Equation 1 using only shift and add operations.

Figure 4:
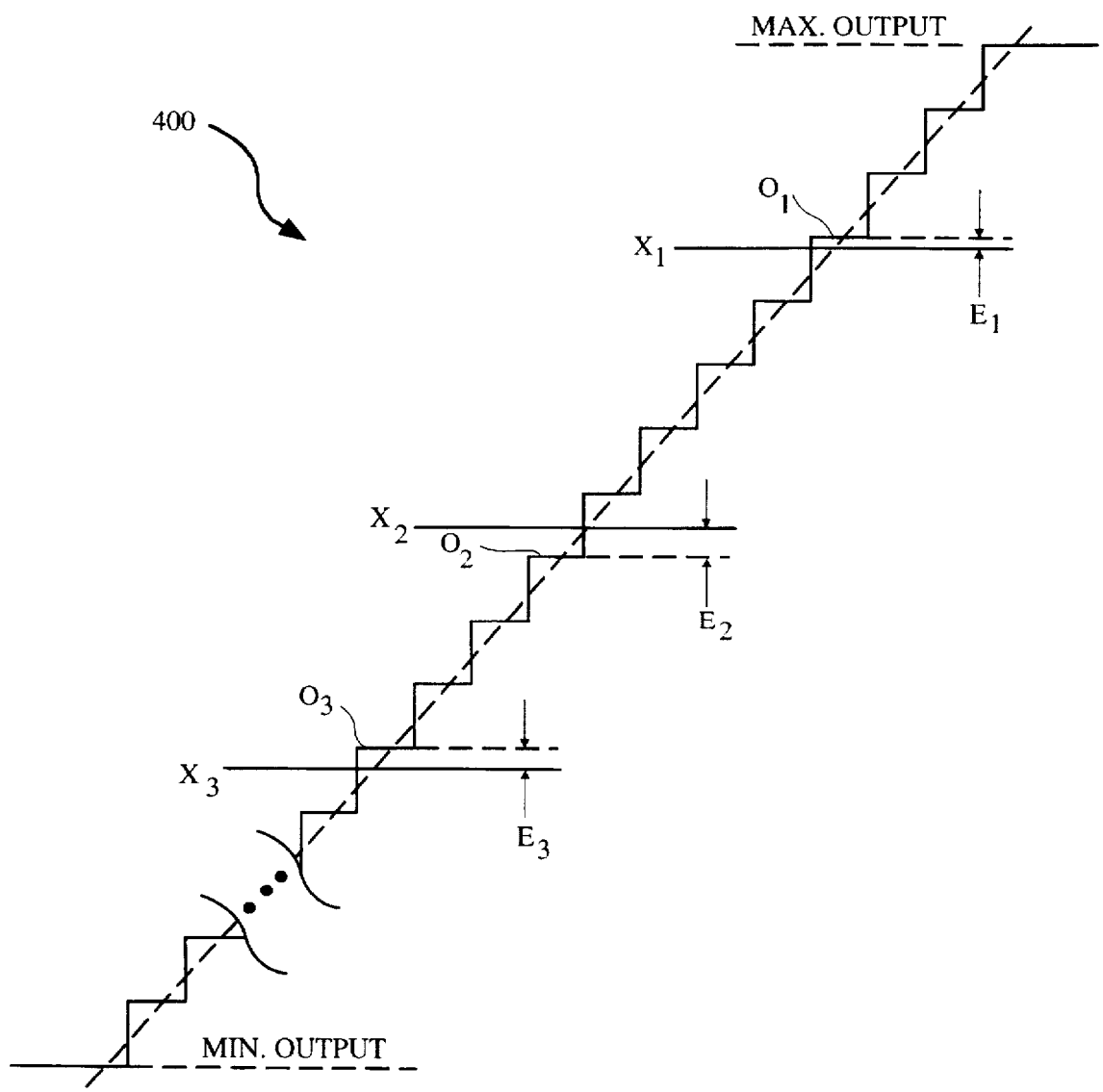
FIG. 4 is a diagram of an exemplary curve of the input/output characteristics of the digital-to-analog converter illustrated in FIG. 1.

FIG. 4 is a diagram of an exemplary curve 400 of the input/output characteristics of the digital-to-analog converter 110 illustrated in FIG. 1. The exemplary curve 400 has a plurality of quantizing steps between the minimum output and the maximum output. For the following discussion, assume that the discussion pertains only to the positive half of the range of the digital-to-analog converter 110. Hence, the range of the digital-to-analog converter 110 would be from zero (0) to a maximum positive output. As an example, a 12-bit digital-to-analog converter would have $2^{-11}$ or 2,048 quantizing steps between zero (0) and its maximum positive output. Preferably, an input signal (sample) to be converted by the analog-to-digital converter 110 is near the maximum output because this allows larger reductions (in number of steps) or more oversamples than can be achieved on smaller input signals. In one embodiment, the power of the transmitter 100 can be made adjustable so that the initial sample value $X_1$ (also referred to as initial value or primary value) is adjusted to be near the top of the range of the digital-to-analog converter 110. As illustrated in FIG. 4, the initial value $X_1$ is located near the upper portion in the diagram. The initial value $X_1$ represents the actual sampled value of the digital signal output from the digital signal generator 106. Also illustrated in FIG. 4 are two oversample values that are produced by the oversampler 108 in accordance with the invention. For example, for the case where N=2, FIG. 4 would illustrate the actual sampled value and both the oversample values. The oversampler 108 is of course capable of producing more or less oversamples as desired, but for ease of illustration only two oversample values are illustrated in FIG. 4. The first oversample value $X_2$ is shown as having its output level reduced (in a lower step) as compared with the first oversample $X_1$. Likewise, the second oversample $X_3$ is shown having its output level reduced as compared with the first oversample value $X_2$.

The amount by which the output level for the oversampled value is reduced from the previous value depends on the variable n. The generally available range for n is greater than 1 but less than m. For the exemplary embodiment illustrated in FIG. 4, assume that n=8. As a result, the reduction factor used to determine the oversample values is $(1-2^{-8})$. Hence, to determine the first oversample value $X_2$, the initial value $X_1$ is reduced by a factor of $(1-2^{-8})$. Then, to determine the second oversample $X_3$, the first oversample value $X_2$ is reduced by a factor of $(1-2^{-8})$. The amount of the reduction to the oversample values is proportional to the signal magnitude of the previous value; hence, each subsequent oversample is reduced less and less. Since the reduction amount is independent of the quantization steps of the digital-to-analog converter 110, the quantization errors for the values are uncorrelated with one another.

For each of the initial values $X_1$, the first oversample value $X_2$ and the second oversample value $X_3$, FIG. 4 also illustrates quantization errors $E_1$, $E_2$ and $E_3$, respectively. The quantizing error is the output signal level (O) of the digital-to-analog converter minus the input signal level (X) to the digital-to-analog converter. Note that the quantization error E for each of the values is different and essentially randomized or uncorrelated. The initial value $X_1$ has a quantization error $E_1$ which is a positive error. The quantization error $E_1$ is the output $O_1$ less the initial value $X_1$. The first oversample value $X_2$ has a quantization error $E_2$ which is a negative value. The quantization error $E_2$ is the output $O_2$ less the first oversample value $X_2$. The second oversample value $X_3$ has a quantization error $E_3$ which is a negative value. The quantization error $E_3$ is the output $O_3$ less the second oversample value $X_3$. Also note that the quantization errors $E_1$, $E_2$ and $E_3$ are all different in their sign and magnitude. The result is that the quantization noise is uncorrelated.

Bi-directional digital data transmission systems are presently being developed for high-speed data communication. One standard for high-speed data communications over twisted-pair phone lines that has developed is known as Asymmetric Digital Subscriber Lines (ADSL). Another standard for high-speed data communications over twisted-pair phone lines that is presently proposed is known as Very High Speed Digital Subscriber Lines (VDSL).

The Alliance For Telecommunications Information Solutions (ATIS), which is a group accredited by the ANSI (American National Standard Institute) Standard Group, has finalized a discrete multi tone based approach for the transmission of digital data over ADSL. The standard is intended primarily for transmitting video data and fast Internet access over ordinary telephone lines, although it may be used in a variety of other applications as well. The North American Standard is referred to as the ANSI T1.413 ADSL Standard (hereinafter ADSL standard). Transmission rates under the ADSL standard are intended to facilitate the transmission of information at rates of up to 8 million bits per second over twisted-pair phone lines. The standardized system defines the use of a discrete multi tone (DMT) system that uses 256 "tones" or "subchannels" that are each 4.3125 kHz wide in the forward (downstream) direction. In the context of a phone system, the downstream direction is defined as transmissions from the central office (typically owned by the telephone company) to a remote location that may be an end-user (i.e., a residence or business user). In other systems, the number of tones used may be widely varied. However when modulation is performed efficiently using an inverse fast Fourier transform (IFFT), typical values for the number of available sub-channels (tones) are integer powers of two, as for example, 128, 256, 512, 1024 or 2048 sub-channels.

The ADSL standard also defines the use of a reverse signal at a data rate in the range of 16 to 800 Kbit/s. The reverse signal corresponds to transmission in an upstream direction, as for example, from the remote location to the central office. Thus, the term ADSL comes from the fact that the data transmission rate is substantially higher in the downstream direction than in the upstream direction. This is particularly useful in systems that are intended to transmit video programming or video conferencing information to a remote location over telephone lines.

Because both downstream and upstream signals travel on the same pair of wires (that is, they are duplexed) they must be separated from each other in some way. The method of duplexing used in the ADSL standard is Frequency Division Duplexing (FDD) or echo canceling. In frequency division duplexed systems, the upstream and downstream signals occupy different frequency bands and are separated at the transmitters and receivers by filters. In echo cancel systems, the upstream and downstream signals occupy the same frequency bands and are separated by signal processing.

ANSI is producing another standard for subscriber line based transmission system, which is referred to as the VDSL standard. The VDSL standard is intended to facilitate transmission rates of at least 25.96 Mbit/s and preferably at least 51.92 Mbit/s in the downstream direction. To achieve these rates, the transmission distance over twisted pair phone lines must generally be shorter than the lengths permitted using ADSL. Simultaneously, the Digital, Audio and Video Council (DAVIC) is working on a similar system, which is referred to as Fiber To The Curb (FTTC). The transmission medium from the "curb" to the customer premise is standard unshielded twisted-pair (UTP) telephone lines.

A number of modulation schemes have been proposed for use in the VDSL and FTTC standards (hereinafter VDSL/FTTC). Most of the proposed VDSL/FTTC modulation schemes utilize frequency division duplexing of the upstream and downstream signals. Another promising proposed VDSL/FTTC modulation scheme uses periodic synchronized upstream and downstream communication periods are provided that do not overlap with one another. That is, the upstream and downstream communication periods for all of the wires that share a binder are synchronized. With this arrangement, all the very high speed transmissions within the same binder are synchronized and time division duplexed such that downstream communications are not transmitted at times that overlap with the transmission of upstream communications. This is also referred to as a (i.e. "ping pong") based data transmission scheme. Quiet periods, during which no data is transmitted in either direction, separate the upstream and downstream communication periods. For example, with a 20-symbol superframe, two of the DMT symbols in the superframe are silent (i.e., quite period) for the purpose of facilitating the reversal of transmission direction on the phone line. In such a case, reversals in transmission direction will occur at a rate of about 4000 per second. For example, quiet periods of about 10–25 µs have been proposed. The synchronized approach can be used a wide variety of modulation schemes, including multi-carrier transmission schemes such as Discrete Multi tone modulation (DMT), as well as single carrier transmission schemes such as Quadrature Amplitude Modulation (QAM), Carrierless Amplitude and Phase modulation (CAP), Quadrature Phase Shift Keying (QPSK), or vestigial sideband modulation. When the synchronized time division duplexed approach is used with DMT it is referred to as synchronized DMT (SDMT).

Figure 5:
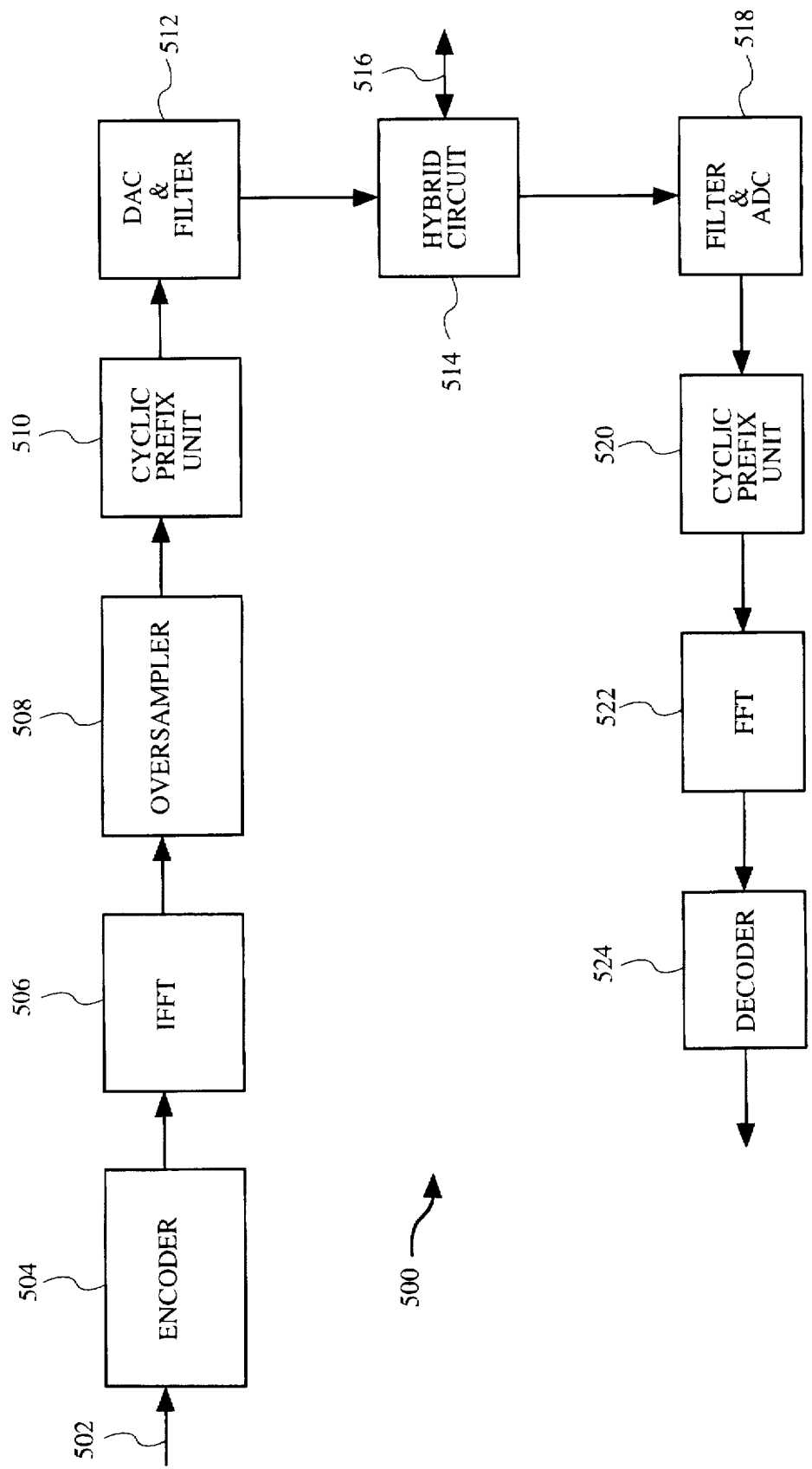
FIG. 5 is a transmission system in accordance with an embodiment of the invention.

FIG. 5 is a transmission system 500 in accordance with another embodiment of the invention. In particular, the transmission system 500 is associated with a remote terminal of an ADSL transmission system using DMT modulation. An upstream information signal 502 is supplied to an encoder 504. The output of the encoder 504 is supplied to an IFFT 506 to transform the signal from the frequency domain to the time domain. Next, an oversampler 508 performs an oversampling of the signal in the same manner as previously discussed above with respect to the oversampler 108 illustrated in FIG. 1. A cyclic prefix unit 510 then adds a cyclic prefix to the signal samples from the oversampler 508. The output of the cyclic prefix unit 510 is supplied to a digital-to-analog converter (DAC) and filter unit 512. The resulting analog signal is then forwarded to a hybrid circuit 514 which couples the analog signal to a transmission path 516. As an example, the transmission path 516 in a case of ADSL transmission is a two-wire subscriber line. The two-wire subscriber line operates as a bi-directional transmission path.

The transmission system 500 also includes a receiving side. The receiving side includes a filter and an analog-to-digital (ADC) unit 518 which converts a received analog signal into a digital signal. The digital signal is then supplied to a cyclic prefix unit 520 which removes the cyclic prefix from the digital signal. The resulting signal is then supplied to a fast Fourier transform (FFT) 522 which converts the time-domain sequence into the frequency domain. In other words, the FFT 552 demodulates the digital signal. Then, the resulting signal is supplied to a decoder 524 which codes the signal to produce an output signal. With ADSL transmissions, the output signal is known as a downstream information signal.

The cyclic prefix added by the unit 510 and removed by the unit 520 consists of a repetition of information from the end of a data block in order to provide a guard space to eliminate interference from one transmitted data signal to the next. The encoder 504 and the IFFT 506 can implement trellis coded modulation, and the FFT 552 and the decoder 524 can implement trellis coded demodulation of the respected signals.

In the above-described embodiments, the oversampling technique according to the invention has been described.

The preferred scaling factor used to produce the oversample values is a reduction factor $(1-2^{-n})$, where $2^{-n}$ is referred to as a reduction amount. The variables N, n and m vary depending on the particular implementation of the transmission system. The variable N is an indicator of the number of oversamples to be taken. The variable n is an indicator of the power of two (2) that is used to determine the scaling factor. The variable m is the number of bits of the digital-to-analog converter of the transmission system. Generally, n is an integer greater than 1. In most cases, n is an integer greater than 2 and less than m−2. A typical value for n is the integer part of m/2.

As an example, consider the design for a 12-bit digital-to-analog converter (m=12). If the input signal were near the maximum output level of the digital-to-analog converter, a decrement (i.e., reduction amount) of $2^{-11}$ (n=11) (i.e., multiplying each of the repeated samples by a reduction factor of $1-2^{-11}$) would be sufficient to ensure that successively reduced samples would be quantized to different values, and would partially decorrelate the quantization noise. A decrement about four times larger (i.e., $2^{-9}$) would be needed to almost completely decorrelate the noise. However, in multi carrier transmission systems, the input multi carrier signal has a high peak-to-average ratio, which means that the majority of the primary samples (i.e., before oversampling) have an amplitude that is less than one eighth ($2^{-3}$) of the maximum. Therefore, a decrement of at least $2^{-8}$ is needed to ensure that the majority of samples are successively quantized to different levels, and a decrement of 2–6 is needed to decorrelate the quantization noise over most of the dynamic range of a multicarrier signal. With an oversampling ratio of 8 (one primary sample and 7 oversamples), the loss to output power is about 0.5 dB.

Alternatively, the scaling factor could be a increase factor $(1+2^{-n})$, where $2^{-n}$ is referred to as an increase amount. Here, the processing is essentially the same as the previously described embodiments, except that addition replaces subtraction and instead of applying a reduction factor to obtain the oversamples, an increase factor is applied. In this case, Equation 1 is replaced by Equation 2 which follows.

$$X_i = X_{i-1}(1+2^{-n}), \quad (2)$$

where n is an integer greater than 1 and less than m, with m being an integer indicating the number of bits of the digital-to-analog converter 110. The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for reducing the quantization noise caused by a m-bit digital-to-analog converter, said method comprising:

(a) receiving a digital signal to be transmitted;

(b) oversampling the digital signal to produce a series of output values, the series of output values including a primary value and one or more subsequent values, and each of the subsequent values being scaled from the respective previous one of the values by a factor of $(1+2^{-n})$, where n and m are integers and n is less than m; and (c) supplying the output values to the digital-to-analog converter.

2. A method as recited in claim 1, wherein said method operates to improve the signal-to-noise quantization ratio by spreading the quantization error induced by the digital-to-analog converter over an enlarged frequency range created by said oversampling (b).

3. A method as recited in claim 1, wherein when the primary value is denoted $X_1$ and the subsequent values are denoted $X_i$, where i=2 to N, and wherein said oversampling (b) determines the subsequent values in accordance with the following equation:

$$X_i = X_{i-1}(1 \pm 2^{-n}),$$

where n is an integer greater than 1 and less than m−1.

4. A method as recited in claim 3, wherein n is an integer greater than 2 and less than m−2.

5. A method as recited in claim 3, wherein the scaling provided by said oversampling (b) reduces each of the subsequent values by $(1-2^{-n})$ with respect to the respective previous one of the values.

6. A method as recited in claim 3, wherein said oversampling (b) comprises the following operations to implement the equation:

obtaining the value $X_{i-1}$;

shifting right the value $X_{i-1}$ a total of n places to produce an intermediate value $Y_{i-1}$; and subtracting the intermediate value $Y_{i-1}$ from the value $X_{i-1}$ or adding the intermediate value $Y_{i-1}$ to the value $X_{i-1}$ to determine the value $X_i$.

7. A transmission system having an input line and transmission lines, comprising:

an encoder for encoding an input signal over the input line to produce a digital signal for transmission;

an oversampling unit, operatively connected to said encoder, for oversampling the digital signal to produce a primary sampled value and at least one oversampled value, a first of the oversampled values being scaled by a predetermined factor with respect to the first sampled value, and any other oversampled values being successively scaled by the predetermined factor from the respective previous oversampled value;

a digital-to-analog converter, operatively connected to said oversampling unit, for converting the primary sampled value and the at least one oversampled values to analog signals; and an interface circuit for coupling the analog signals to the transmission lines.

8. A transmission system as recited in claim 7, wherein the predetermined factor is $(1 \pm 2^{-n})$.

9. A transmission system as recited in claim 7, wherein said oversampling unit is performed by a processor, and said processor determines the at least one oversampled values using only shift and add operations.

10. A transmission system as recited in claim 7, wherein said digital-to-analog converter induces a quantization error, and wherein the oversampling performed by said oversampling unit operates to improve the signal-to-quantization noise ratio by spreading the quantization error induced by said digital-to-analog converter over an enlarged frequency range associated with the oversampling.

11. A transmission system as recited in claim 7, wherein the primary sampled value is denoted $X_1$ and the oversampled values are denoted $X_i$, where i=2 to N, and wherein said oversampler determines the oversampled values in accordance with the following equation:

$$X_i = X_{i-1}(1 \pm 2^{-n}),$$

where n is an integer greater than 1 and less than m−1.

12. A transmission system as recited in claim 11, wherein n is an integer greater than 2 and less than m−2.

13. A transmission system as recited in claim 7, wherein the primary sampled value is denoted $X_1$ and the oversampled values are denoted $X_i$, where i=2 to N, and wherein said oversampler comprises:

means for obtaining the value $X_{i-1}$;

means for shifting right the value $X_{i-1}$ a total of n places to produce an intermediate value $Y_{i-1}$; and means for subtracting the intermediate value $Y_{i-1}$ from the value $X_{i-1}$ or adding the intermediate value $Y_{i-1}$ to the value $X_{i-1}$ to determine the value $X_i$.

14. A transmission system as recited in claim 13, wherein said oversampling unit is performed by a processor, and said processor determines the at least one oversampled values using only shift and add operations.

15. A transmission system as recited in claim 13, wherein said digital-to-analog converter induces a quantization error, and wherein the oversampling performed by said oversampling unit operates to improve the signal-to-quantization noise ratio by spreading the quantization error induced by said digital-to-analog converter over an enlarged frequency range associated with the oversampling.

16. A terminal for a transmission system using multi carrier modulation, said terminal comprising:

transmit path including a multichannel modulating apparatus for transforming a transmit signal from a frequency domain to a time domain, an oversampler for oversampling the transmit signal output by said multichannel modulating apparatus, the transmit signal samples produced by said oversampler form a series of sample values, the series of sample values includes a primary value followed by one or more subsequent values, and each of the subsequent values being scaled from the respective previous one of the sample values by a predetermined factor, and a digital-to-analog converter (DAC) for converting the transmit signal samples produced by said oversampler to analog transmit signals for transmission;

a receive path including an analog-to-digital converter (ADC) for converting an analog receive signal into digital receive signal samples, and a multichannel demodulating apparatus for transforming the digital receive signal samples from the time domain to the frequency domain; and a hybrid circuit coupled to the transmit path and the receive path for coupling the analog transmit signals to and the analog receive signals from a bi-directional transmission path.

17. A terminal as recited in claim 16, wherein said multichannel modulating apparatus is an Inverse Fast Fourier Transform apparatus, and wherein said multichannel demodulating apparatus is a Fast Fourier Transform apparatus.

18. A terminal as recited in claim 16, wherein, by scaling each of the subsequent values with respect to the respective previous one of the sample values by the predetermined factor, said oversampler operates to improve the signal-to-quantization noise ratio for the analog transmit signals to be transmitted by spreading the quantization error induced by said digital-to-analog converter over the enlarged frequency band associated with the oversampling performed by said oversampler.

19. A terminal as recited in claim 16, wherein with the primary value is denoted $X_1$ and the subsequent values are denoted $X_i$, where i=2 to N, said oversampler determines the subsequent values in accordance with the following equation:

$$X_i = X_{i-1}(1 \pm 2^{-n}),$$

where n is an integer greater than 1 and less than m−1, and where $(1-2^{-n})$ represents the predetermined factor.

20. A terminal as recited in claim 16, wherein said oversampler is implemented by a digital signal processor.

* * * * *